(12) United States Patent
Allott (10) Patent No.: US 7,012,487 B2
(45) Date of Patent: Mar. 14, 2006

(54) TRANSCONDUCTANCE DEVICE EMPLOYING NATIVE MOS TRANSISTORS

(75) Inventor: Stephen Allott, Scotts Valley, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/837,897

(22) Filed: Apr. 18, 2001

(65) Prior Publication Data

US 2002/0153973 A1   Oct. 24, 2002

(51) Int. Cl.
*H03H 11/00*   (2006.01)

(52) U.S. Cl. .................. 333/214; 333/215; 331/132

(58) Field of Classification Search ............... 333/214, 333/215; 330/277; 331/117 FE, 132–135, 331/57

See application file for complete search history.

(56) References Cited

U.S. PATENT DOCUMENTS

| | | | | |
|---|---|---|---|---|
| 4,442,481 A | * | 4/1984 | Brahmbhatt | 326/106 |
| 4,533,876 A | * | 8/1985 | Haque et al. | 330/253 |
| 4,710,654 A | * | 12/1987 | Saitoh et al. | 327/263 |
| 4,972,098 A | * | 11/1990 | Boudewijns | 327/566 |
| 5,117,205 A | * | 5/1992 | Nauta | 331/117 FE |
| 5,210,450 A | * | 5/1993 | Parkinson | 327/269 |
| 5,319,316 A | * | 6/1994 | Fensch | 330/253 |
| 5,384,501 A | * | 1/1995 | Koyama et al. | 327/336 |
| 5,463,352 A | * | 10/1995 | Chen | 331/1 R |
| 5,963,084 A | * | 10/1999 | Eschauzier | 327/553 |
| 6,194,972 B1 | * | 2/2001 | Brown | 331/108 B |
| 6,545,534 B1 | * | 4/2003 | Mehr | 330/69 |

OTHER PUBLICATIONS

Schaumann, "Simulating Lossless Ladders with Transconductance-C Circuits," Mar. 1998, IEEE Transactions on Circuits and Systems-II: Analog and Digital Signal Processing, vol. 45, No. 3.*

Johns, David A, and Martin, Ken, "CMOS Transconductors Using Triode Transistors," *Analog Integrated Circuit Design*, John Wiley & Sons, Inc., New York, 1997, pp 597-600.

Tsividis, Yannis P., "Model Accuracy and Parameter Extraction," *Operation and Modeling of the MOS Transistor*, McGraw-Hill, 1987, pp. 154-160.

* cited by examiner

*Primary Examiner*—Robert Pascal
*Assistant Examiner*—Kimberly Glenn
(74) *Attorney, Agent, or Firm*—Sterne, Kessler, Goldstein & Fox, PLLC (57) ABSTRACT

A system on chip such as a radio receiver has reduced suceptibility to voltages in the bulk silicon by using gyrator elements in the receiver with each gyrator element including a plurality of current sources interconnected to provide output transconductance voltages, and a variable load for the current sources including first and second load resistors each serially connected with one other plurality of current sources. A variable resistance interconnects nodes of the load resistors with the variable resistance comprising a pair of native MOS transistors having low threshold voltages. In a preferred embodiment the first and second load resistors comprise first and second MOS transistors with the pair of native transistors serially connected between source elements of the first and second MOS transistors.

18 Claims, 6 Drawing Sheets

The GM VCO

FIG.6
The GM VCO

TRANSCONDUCTANCE DEVICE EMPLOYING NATIVE MOS TRANSISTORS

BACKGROUND OF THE INVENTION

This invention relates generally to electrical systems which are integrated in a semiconductor chip, and more particularly the invention relates to systems for signal processing such as telecommunications systems and to gyrator filter elements and transconductance devices used therein.

Figure 1:
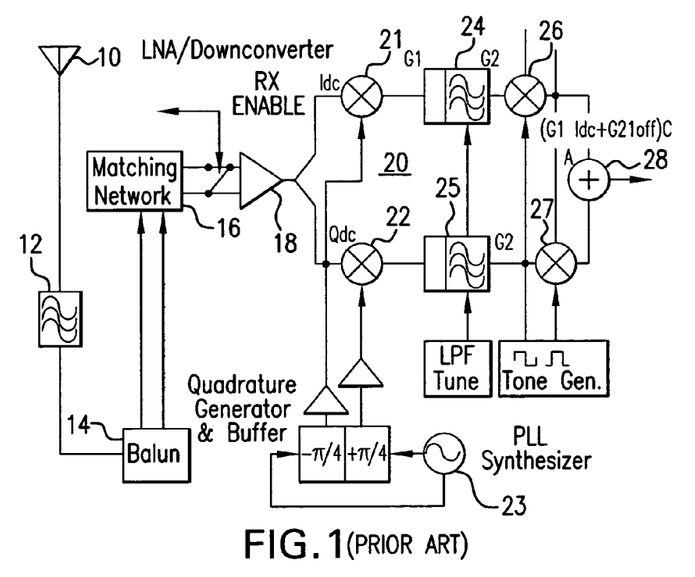
FIG. 1 is a functional block diagram of a conventional wireless receiver.

FIG. 1 is a functional block diagram of a wireless receiver for recovering transmitted data. Typically, the receiver includes an antenna 10, filter 12, balan 14, impedance matching network 16, and low noise amplifier 18 for receiving and preparing a signal at a transmission frequency for a frequency down converter shown generally at 20. Down converter 20 includes phase quadrature mixers 21, 22 driven by a phase lock loop synthesizer 23 which reduce the frequency of the received signal and pass the phase quadrature mixer outputs to low pass frequency filters 24, 25. The filtered signals are then passed to mixers 26, 27 which step the filtered signals to an intermediate frequency (IF) for further processing and signal recovery by demodulation of the IF signal as assumed at 28.

Figures 2A, 2B:
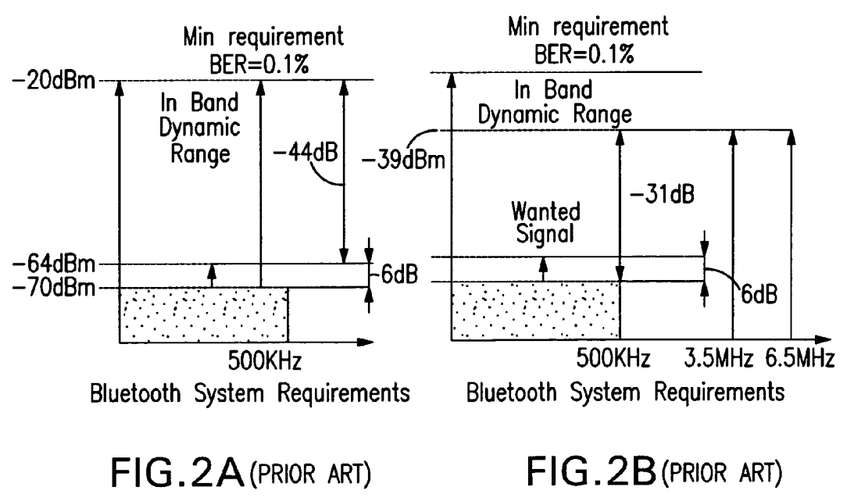
FIGS. 2A, 2B are frequency charts illustrating Bluetooth system requirements.

The system of FIG. 1 is a fabricated in a single semiconductor chip as an integrated system on a chip. An operating standard, known as Bluetooth, has been established for wireless telecommunications systems on a chip which has stringent operating requirements as illustrated in FIGS. 2A, 2B. The maximum usable signal level the receiver shall operate at will be better than −20 dBm and the reference sensitivity level referred to is −70 dBm.

The charts of FIGS. 2A, 2B show the two-tone requirements for Bluetooth compliance. The reference sensitivity performance, which is a Bit Error Rate (BER)+0.1%, shall be met with a wanted signal at a frequency $f_0$ with a power level 6 db over the reference sensitivity level in the presence of the following: A −39 dBm signal at f1 and a Bluetooth modulated signal at f2 of −39 dBm, where f0, f1, and f2 are defined as $f0=2f1-f2$ and $f2-f1=n*1$ mhz, where n can be 3, 4 or 5. System simulations have shown that to achieve a BER of less than 0.1% requires a signal to noise ratio of 20 db (worst case), thus to be Bluetooth compliant in the presence of out of band blockers, the third order in a modulation shall be −64−20 dBm=−84 dBm.

System simulations have shown that channel selection of a Bluetooth signal in the presence of adjacent channel blockers, with powers not exceeding −39 dBM, can be achieved using a fc accuracy of better than 5%.

Figure 3A:
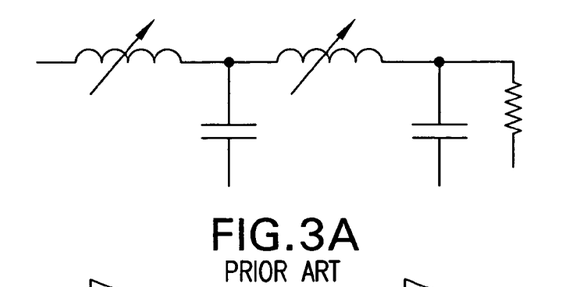
FIGS. 3A, 3B illustrate filter elements using inductive elements and transconductance devices, respectively.
Figure 3B:
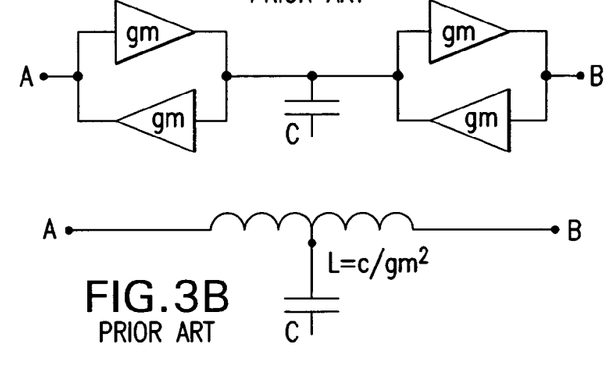

Filter elements in the system require inductive elements such as shown in FIG. 3A. Since inductors are difficult to realize in integrated circuits and systems, a functional equivalent inductive element, or gyrator, has been devised. As shown in FIG. 3B, the gyrator comprises variable transconductance elements, GM, serially connected with a shunt capacitance, C.

Figures 4, 9:
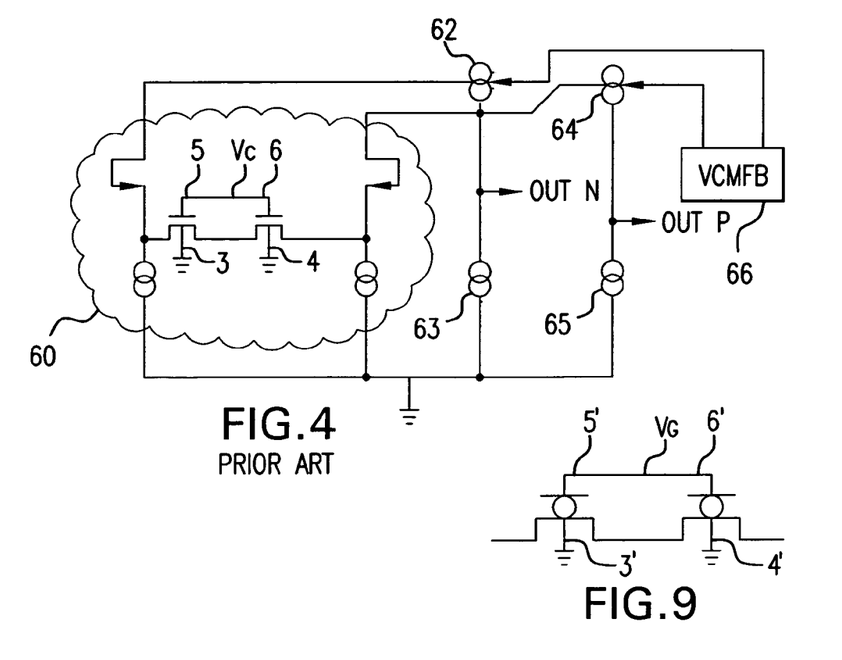
FIG. 4 is a schematic of a known transconductance cell as used in the filter of FIG. 3B.
FIG. 9 is a schematic of native transistors as used in a transconductance cell in accordance with the invention.

FIG. 4 is a schematic of a known transconductance cell such as discussed Schaumann, simulating Lossless ladders with Transconductance—C Circuits, IEEE Transactions on Circuits and Systems II, Analog and Digital Signal Processing, March 1998, pages 407–410; and Johns and Martin, *Analog Integrated Circuit Design*, John Wiley and Sons, Inc., 1997, pp 597–600. These prior art references discuss the use of CMOS transconductance using triode (MOS) transistors.

A problem with the use of the known transconductance cell lies in adverse effects of source-bulk voltage (VSB) on MOS transistors used in the transconductance cell. Variations in VSB due to bulk (chip) stray voltages can adversely affect transconductance. Further, control voltage in a gyrator can have a limited dynamic range when using conventional enhancement MOS transistors.

BRIEF SUMMARY OF THE INVENTION

In accordance with the invention a transconductance element or cell in a system on a chip or other integrated circuit has improved response to noise in a semiconductor chip arising from extraneous signals propagated from analog and digital circuitry within the system.

A feature of the invention is the use of native transistors in the transconductance cell. The native MOS transistor has a lower threshold voltage $V_t$ than the conventional enhancement MOS transistor, which leads to lower variation of GM due to source to bulk voltage variations.

In one embodiment, a ring oscillator employing cross-coupled transconductance devices generates a control voltage, $V_c$, which controls transconductance devices in low pass filters and achieves more accurate control of the filter cutoff frequencies. The system has reduced substrate noise susceptibility via VSB variations. The reduction in transconductance variation is particularly applicable with low supply voltage constraints of present and future systems on a chip.

The invention and objections and features thereof will be more readily apparent from the following detailed description and appended claims when taken with the drawings.

DETAILED DESCRIPTION OF ILLUSTRATIVE EMBODIMENTS

Figure 5:
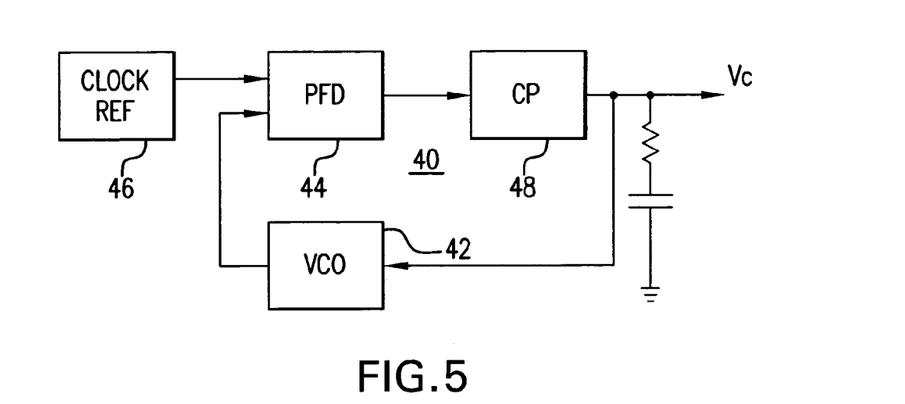
FIG. 5 is a schematic of a ring oscillator which generates a control voltage, $V_c$.

FIG. 5 is a functional block diagram of a ring oscillator which generates a control voltage, $V_c$, for controlling low pass filters 24, 25 in FIG. 1. The ring oscillator includes a voltage controlled oscillator 42 in a phase lock loop including a phase/frequency detector 44 which receives the output of Vco 42 and compares the output with a reference frequency from crystal oscillator 46. The phase and frequency difference detected by detector 44 is applied to a charge pump 48 which generates a voltage for controlling Vco 42.

The voltage from charge pump 48 is the control voltage, $V_c$, which is also applied to control transconductance devices in low pass filters 24, 25.

Figure 6:
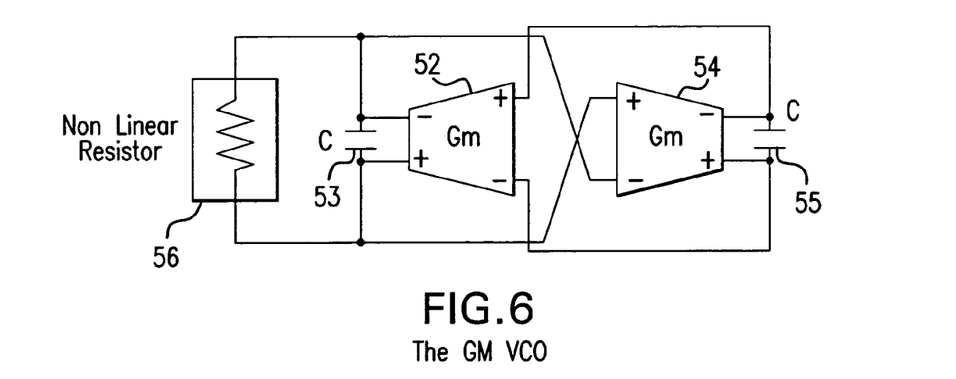
FIG. 6 is a schematic of a voltage controlled oscillator for use in the ring oscillator of FIG. 5 and comprising cross coupled transconductance cells.

FIG. 6 is a schematic of Vco 42 implemented as a second order harmonic oscillator including cross coupled transconductance cells 52, 54, and capacitors 53, 55 and a non-linear resistor 56. As noted above, the control voltage generated by ring oscillator of FIG. 5 is used to control the transconductance, GM, stages within the filter and hence the cutoff frequency of filters 24, 25. Each transconductance cell or GM stage can be identical schematically to the transconductance cell shown in FIG. 4 including transistors 3 and 4 having gates 5 and 6, respectively, within circle 60. The circled transistor devices shown at 60 in FIG. 4 function as load resistors for current sources 62, 64 which are serially connected with current sources 63, 65 to provide two outputs Out P and Out N of the transconductance device. Block 66 is a voltage common mode feedback for the current sources, the details of which are known and not described further herein.

Within each transconductance (GM) cell the circled device 60 is used to control the transconductance according to the equation:

$$Gm = \mu\, Cox(W/L)(Vgs-Vt) \quad \text{Equation 1}$$

Where $\mu$ is the surface mobility of the channel (cm$^2$/volt),
Cox is the capacitance per unit area of the gate oxide (F/cm$^2$),
W is the effective channel width of the circled device,
L is the effective channel length of the circled device,
Vgs is the gate to source voltage, and Vt is the threshold voltage of the circled device.

With the PLL tuning scheme it is possible to achieve the 5% frequency tolerance, however this does not take account of noise picked up through the substrate. This noise can severely degrade the performance of the filter within a SOC environment and it is the topic of this patent to improve this. Referring to Equation 1, it is clear that a source of degradation to GM is via the threshold voltage Vt. It is prudent, therefore to examine Vt more closely. The threshold voltage for an n-channel transistor is given by:

$$Vt = Vt0 + \gamma((\sqrt{2|\phi F|+VSB})-+(\sqrt{2|\phi F|})) \quad \text{Equation 2}$$

Where Vt0=Vt(VSB=0),
γ Is the bulk threshold parameter ($\sqrt{\text{volts}}$)
φF is the strong inversion surface potential (volts)
VSB is the source to Bulk Voltage.

It is clear from this equation that any injection of noise between the transistor source and the semiconductor chip bulk will cause a variation in Vt and hence GM. This VSB can easily arise if the source and bulk are not tied down at exactly the same potential. Forcing VSB to be zero throughout the filter can be very difficult to do and an alternative approach is presented herein.

Figure 7A:
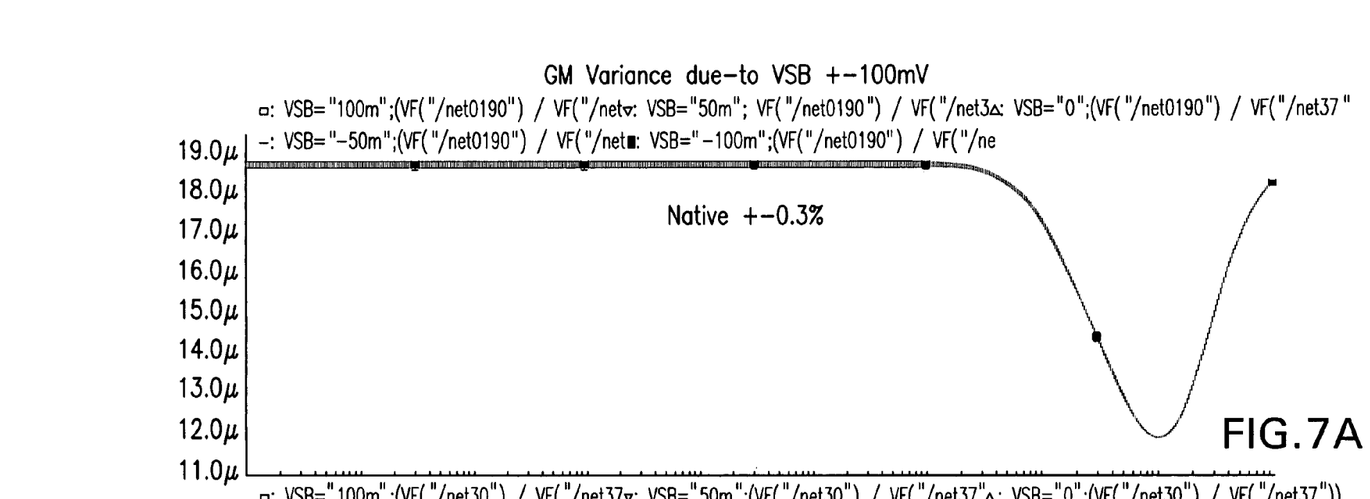
FIGS. 7A, 7B illustrate transconductance variation with varying VSB for a native transistor and for a standard MOS transistor, respectively.
Figure 7B:
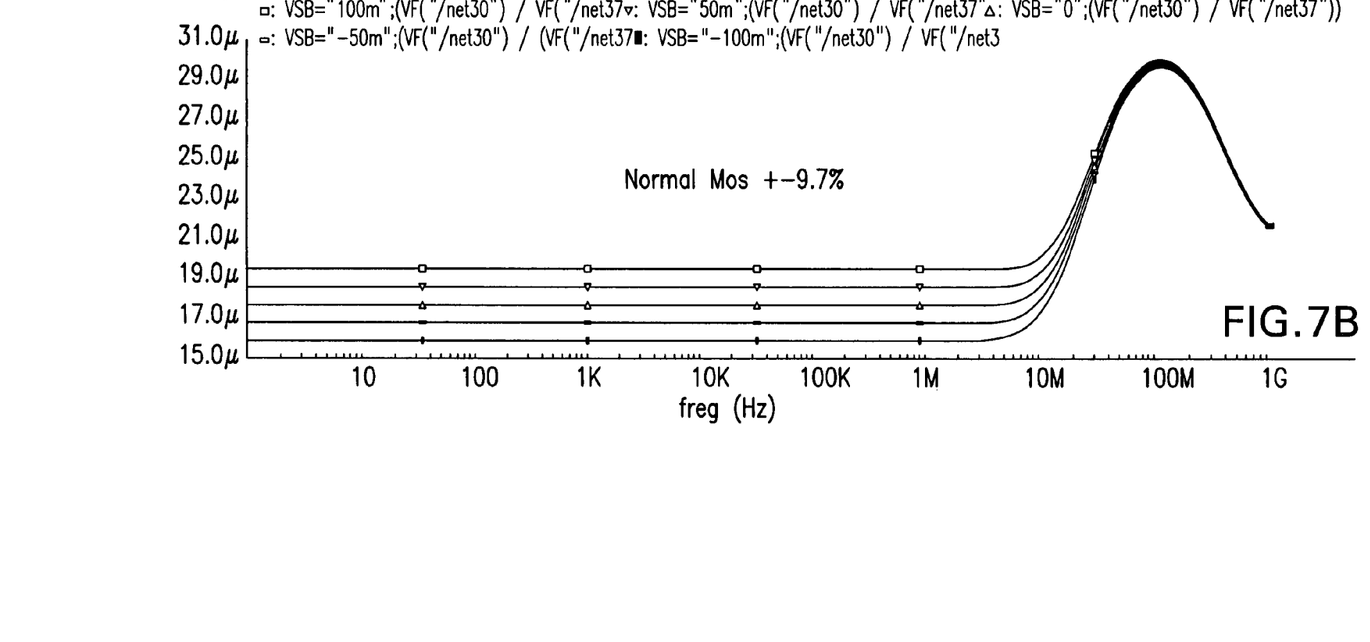

As noted from Equation 1, the threshold voltage, $V_t$, of the MOS transistors affects the transconductance. In accordance with the invention the use of a low to zero threshold voltage transistor, a "native" device, improves the filter performance in the presence of substrate noise. The native transistors 3',4' shown schematically in FIG. 9 are used in the transconductance cell of FIG. 4 in place of conventional enhancement mode transistors 3,4. As is well known in the semiconductor art, a "native" transistor does not have threshold adjusting dopants in the channel region as in conventional MOS transistors. The $V_t$ of a native device used with the transconductance cell of FIG. 4 is a 0.041 volt has a saturation current, $I_{sat}$ of 5.83 mA. Although the $V_t$ of the native device has a similar dependence on VSB as does the conventional MOS transistor, its low absolute value with respect to a Vgs of approximately 500 mV, means that the overall transconductance does not vary much with VSB. FIGS. 7A, 7B illustrate transconductance variance with varying VSB with a native transistor load and with a standard MOS transistor load, respectively. FIG. 7B is the small signal transconductance variance due to ±100 mV VSB using a standard MOS arrangement, whereas FIG. 7A is GM variance using the native MOS transistor. It is noted that the native MOS transistor provides a variance of ±0.3% up to 1 MHz, whereas the standard MOS transistor has a variance of ±9.7% over the same frequency range.

Figure 8A:
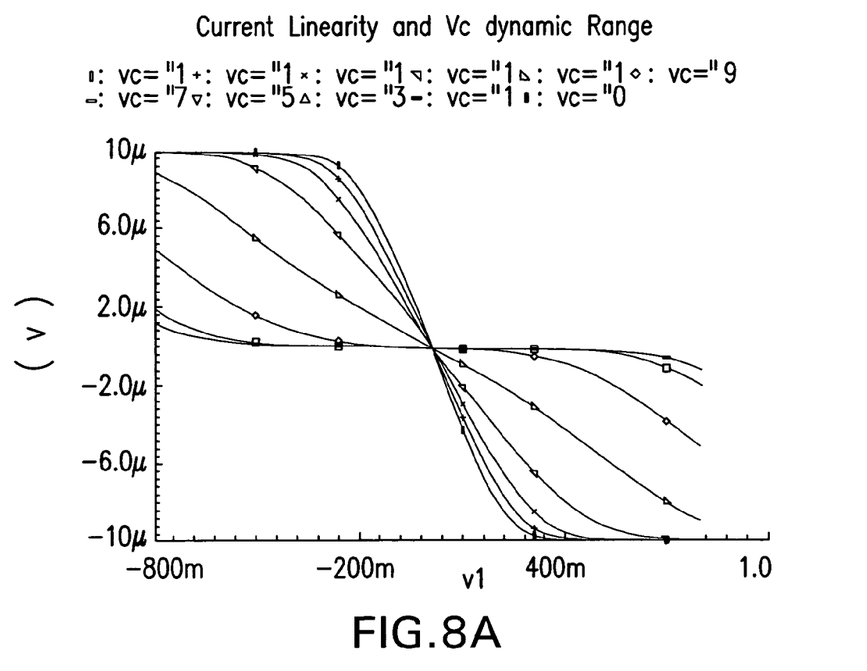
FIGS. 8A–8D are graphs illustrating current linearity and $V_c$ dynamic range for a transconductance cell with normal MOS transistors and with native MOS transistors.
Figure 8B:
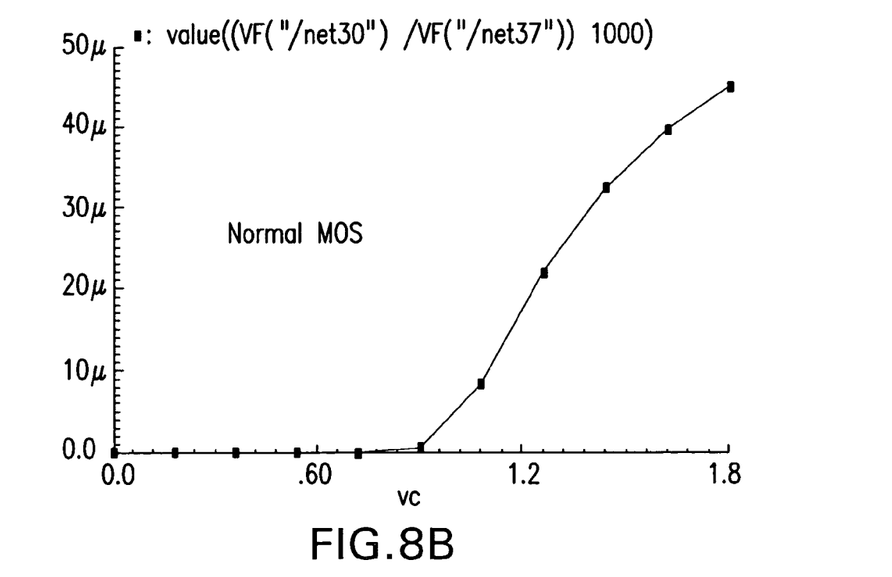
Figure 8C:
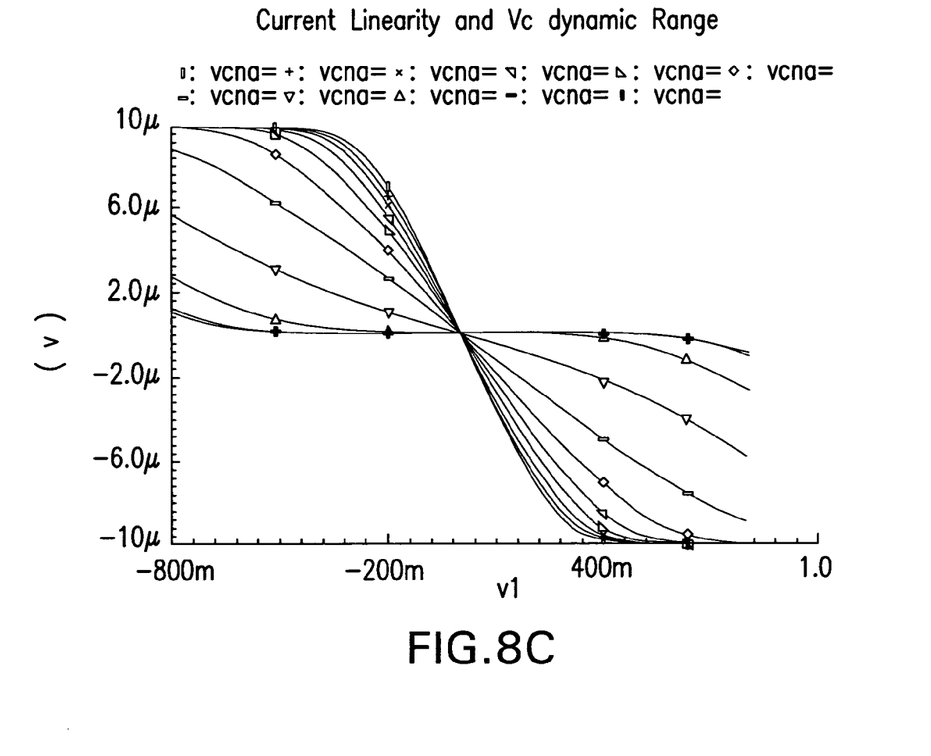
Figure 8D:
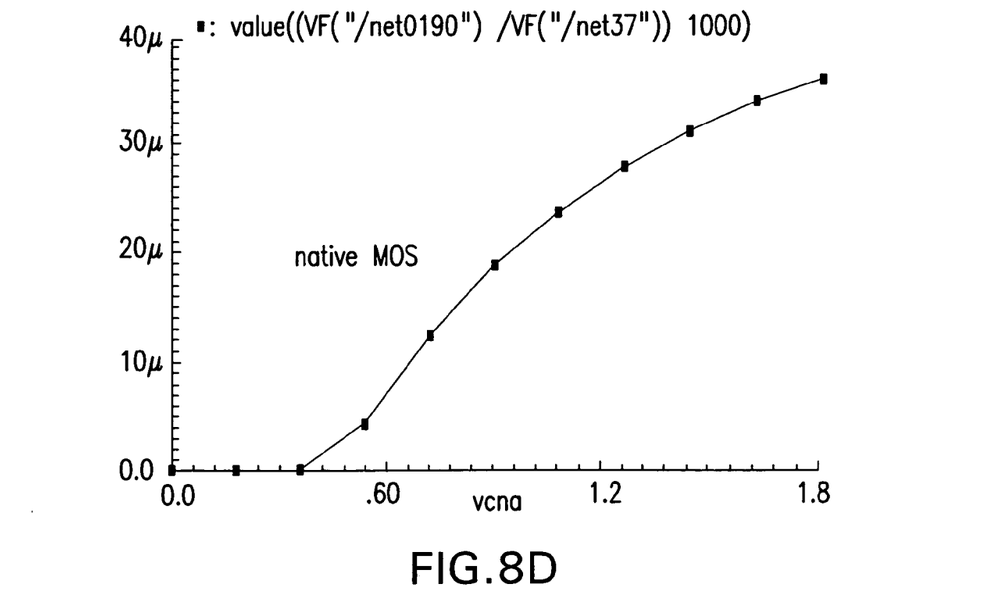

Another advantage using the native MOS transistor is that the control voltage has more dynamic range, as illustrated in FIGS. 8A–8D. FIGS. 8C and 8D illustrate transconductance variance for a given $V_c$. It is clear that the slope or GM gain has changed with the native device without changing the maximum or minimum transconductance values. These plots illustrate that the native transistor devices offer the advantages of providing a sufficiently wide range of transconductance values as the process shrinks and supply voltage, $V_{dd}$ is reduced. Further, the native MOS device has a lower transconductance gain with respect to the transconductance control voltage $V_c$ thus resulting in less jitter of the phase lock lock used to tune the filter, and hence a more stable loop control voltage. Accordingly, a signal processing system on a chip fabricated with transconductance devices employing native MOS transistors as described can have more accurately controlled cutoff frequencies with reduced substrate noise susceptibility via the VSB voltage. The slope of transconductance versus control voltage is reduced and provides a lower jitter phase lock loop for use in filter tuning. The provision for transconductance variance is particularly applicable to low voltage supply constraints as is being encountered now and anticipated to be more so in the future.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. An integrated circuit comprising:
   a voltage controlled oscillator comprising:
      a first gm cell;
      a second gm cell having a noninverting input coupled to a noninverting output of the first gm cell, an inverting input coupled to an inverting output of the first gm cell, a noninverting output coupled to an inverting input of the first gm cell, and an inverting output coupled to a noninverting input of the first gm cell;
      a first capacitance coupled between the noninverting output and inverting output of the first gm cell;
      a second capacitance coupled between the noninverting output and inverting output of the second gm cell; and
   a first filter coupled to the voltage controlled oscillator comprising:
      a third gm cell,
   wherein the first gm cell, the second gm cell, and the third gm cell each comprise a variable resistance, the variable resistance comprising a first native MOS device.

2. The integrated circuit of claim 1 wherein the variable resistance in one or more of the first, second, and third gm cells comprises a second native MOS device coupled in series with the first native MOS device.

3. The integrated circuit of claim 1 wherein a gate of the first native MOS device is configured to receive a control voltage.

4. The integrated circuit of claim 3 further comprising:
a phase/frequency detector having an input coupled to the voltage controlled oscillator; and
a charge pump coupled between the phase/frequency detector and the voltage controlled oscillator.

5. The integrated circuit of claim 4 further comprising a loop filter coupled to an output of the charge pump,
wherein the loop filter is configured to provide the control voltage to the voltage controlled oscillator.

6. The integrated circuit of claim 5 wherein the control voltage is used to tune the first filter.

7. The integrated circuit of claim 5, wherein the control voltage is used to tune the first filter.

8. A method of tuning a filter comprising:
receiving a reference clock signal having a first frequency;
receiving a signal having a second frequency from a voltage controlled oscillator;
comparing the first frequency to the second frequency;
providing a charging signal to a loop filter, the charging signal based on the comparison between the first frequency and the second frequency; and
adjusting the second frequency by:
receiving an output signal from the loop filter; and
using the output signal from the loop filter to adjust a first variable resistance,
wherein the first variable resistance is included in a first gm cell in the voltage controlled oscillator, and the first variable resistance comprises a first native MOS device.

9. The method of claim 8 further comprising:
receiving the output signal from the loop filter with a second filter;
using the output signal from the loop filter to adjust a second variable resistance,
wherein the second variable resistance is included in a second gm cell, and the second variable resistance comprises a second native MOS device,
wherein a value of the second variable resistance determines a frequency characteristic of the second filter.

10. The method of claim 9 wherein the second filter is a low pass filter.

11. The method of claim 10 wherein the frequency characteristic of the second filter is a cutoff frequency of the second filter.

12. The integrated circuit of claim 11 wherein the second variable resistance comprises a plurality of native MOS devices coupled in series.

13. The integrated circuit of claim 11 wherein the second variable resistance comprises two native MOS devices coupled in series.

14. An integrated circuit comprising:
a phase-locked loop configured to tune a filter and comprising:
a phase/frequency detector having a first input, and a second input configured to receive a reference clock;
a charge pump coupled to an output of the phase/frequency detector; and
a voltage controlled oscillator having a control voltage input coupled to an output of the charge pump and an output coupled to the first input of the phase/frequency detector, the voltage controlled oscillator comprising:
a first gm cell;
a second gm cell having a noninverting input coupled to a noninverting output of the first gm cell, an inverting input coupled to an inverting output of the first gm cell, a noninverting output coupled to an inverting input of the first gm cell, and an inverting output coupled to a noninverting input of the first gm cell;
a first capacitance coupled between the noninverting output and inverting output of the first gm cell;
a second capacitance coupled between the noninverting output and inverting output of the second gm cell; and
a first filter having a control voltage input coupled to the output of the charge pump and comprising a third gm cell,
wherein the first gm cell, the second gm cell, and the third gm cell each comprise a variable resistance, the variable resistance comprising a first native MOS device.

15. The integrated circuit of claim 14 wherein the phase-locked loop further comprises a loop filter configured to filter the output of the charge pump.

16. The integrated circuit of claim 14 wherein the variable resistance in one or more of the first, second, and third am cells comprises a second native MOS device coupled in series with the first native MOS device.

17. The integrated circuit of claim 14 wherein a gate of the first native MOS device is configured to receive the output of the charge pump.

18. The integrated circuit method of claim 17 wherein the first filter is a low pass filter.

* * * * *

UNITED STATES PATENT AND TRADEMARK OFFICE
CERTIFICATE OF CORRECTION

| | | |
|---|---|---|
| PATENT NO. | : 7,012,487 B2 | Page 1 of 1 |
| APPLICATION NO. | : 09/837897 | |
| DATED | : March 14, 2006 | |
| INVENTOR(S) | : Stephen Allott | |

It is certified that error appears in the above-identified patent and that said Letters Patent is hereby corrected as shown below:

- In column 5, lines 19 and 20, "The integrated circuit of claim 5, wherein the control voltage is used to tune the first filter." should be replaced with --The integrated circuit of claim 6, wherein the first filter is a low pass filter.--.

- In column 6, line 43, "second, and third arm" should be replaced with --second, and third gm--.

Signed and Sealed this

Twenty-second Day of May, 2007

JON W. DUDAS
*Director of the United States Patent and Trademark Office*